(12) United States Patent
McCracken et al.

(10) Patent No.: US 8,516,433 B1
(45) Date of Patent: Aug. 20, 2013

(54) METHOD AND SYSTEM FOR MAPPING MEMORY WHEN SELECTING AN ELECTRONIC PRODUCT

(75) Inventors: Thaddeus Clay McCracken, Portland, OR (US); Miles P McGowan, Campbell, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 250 days.

(21) Appl. No.: 12/824,065

(22) Filed: Jun. 25, 2010

(51) Int. Cl.
*G06F 17/50* (2006.01)

(52) U.S. Cl.
USPC ........... 716/138; 716/116; 716/117; 716/136; 711/170; 711/171; 711/172; 711/173; 711/202; 711/203; 326/37; 326/38; 326/39

(58) Field of Classification Search
USPC ......... 716/116–117, 136, 138; 711/170–173, 711/202–203; 326/37–39
See application file for complete search history.

(56) References Cited

U.S. PATENT DOCUMENTS

| | | | |
|---|---|---|---|
| 5,673,198 A | 9/1997 | Lawman et al. | |
| 6,102,961 A | 8/2000 | Lee et al. | |
| 6,205,063 B1 * | 3/2001 | Aipperspach et al. | 365/200 |
| 6,209,075 B1 * | 3/2001 | Lau | 711/171 |
| 6,578,174 B2 | 6/2003 | Zizzo | |
| 6,754,882 B1 | 6/2004 | Sanchez et al. | |
| 6,941,538 B2 | 9/2005 | Hwang et al. | |
| 7,055,113 B2 | 5/2006 | Broberg et al. | |
| 7,058,921 B1 | 6/2006 | Hwang et al. | |
| 7,216,328 B2 | 5/2007 | Hwang et al. | |
| 7,353,467 B2 | 4/2008 | Robertson et al. | |
| 7,406,674 B1 | 7/2008 | Ogami et al. | |
| 7,430,725 B2 | 9/2008 | Broberg et al. | |
| 7,475,217 B2 * | 1/2009 | Abe et al. | 711/171 |
| 7,509,614 B2 | 3/2009 | Hwang et al. | |
| 7,576,557 B1 * | 8/2009 | Tseng et al. | 326/9 |
| 7,979,835 B1 | 7/2011 | Schumacher et al. | |
| 8,069,428 B1 | 11/2011 | Ogami et al. | |
| 8,095,832 B2 * | 1/2012 | Lee et al. | 714/710 |
| 8,156,453 B1 | 4/2012 | Nazarian et al. | |
| 2005/0086039 A1 | 4/2005 | Hamlin | |
| 2006/0212869 A1 * | 9/2006 | Bril et al. | 718/102 |

OTHER PUBLICATIONS

Avissar et al., Heterogeneous Memory Management for Embedded System, 2001, ACM, pp. 1-10.*
Non-Final Office Action dated Jul. 2, 2012 for U.S. Appl. No. 12/824,042.
Stephen Trimberger, "A Reprogrammable Gate Array and Applications," Proceedings of the IEE vol. 81, No. 7, Jul. 1993.
Anthony L. Slade, et al., "Reconfigurable Computing Application Frameworks," Brigham Young University, 2003.
"My First FPGA Design Tutorial," Altera, Jul. 2008.

(Continued)

*Primary Examiner* — Nghia Doan
(74) *Attorney, Agent, or Firm* — Vista IP Law Group, LLP

(57) ABSTRACT

An improved approach is described for analyzing and estimating products having arrays of uncommitted logic, and matching these products to electronic designs. The approach can be applied to any type of product that include arrays of uncommitted logic, such as gate arrays and field programmable gate arrays. An approach is described for performing memory mapping in the context of selecting an electronic product having an array of uncommitted logic.

30 Claims, 9 Drawing Sheets

(56) References Cited

OTHER PUBLICATIONS

Stephen Brown et al., "Architecture of FPGAs and CPLDs: A Tutorial," Department of Electrical and Computer Engineering University of Toronto, 1996.

Notice of Allowance dated Oct. 10, 2012 for U.S. Appl. No. 12/824,042.
Supplemental Notice of Allowance dated Oct. 24, 2012 for U.S. Appl. No. 12/824,042.
Supplemental Notice of Allowance dated Nov. 9, 2012 for U.S. Appl. No. 12/824,042.

* cited by examiner

Figure 5

Estimation Results

Project: New Project
Spec: New Spec

Last Saved:
Last Estimated: Jun 23 2010 2:19PM

Summary Results

| | | | | |
|---|---|---|---|---|
| Recommended Die | | | Die_2 | |
| Recommended Package | Type | Pins | Pin Pitch | Body Size |
| | BGA | 240 | 0.8 mm | 15 mm x 15 mm |

Detailed Results

| | Requirements | Die_1 | Die_2 | Die_3 |
|---|---|---|---|---|
| Logic Gates | 104k | ✗ | ✓ | ✓ |
| Memory Bits | | | | |
|   Single Port | 65.5k bits | ✓ | ✓ | ✓ |
|   Dual-port | 36.9k bits | ✓ | ✓ | ✓ |
| Hard IP | | | | |
|   HardIP1 | 1 | ✓ | ✓ | ✓ |
|   HardIP2 | 0 | ✓ | ✓ | ✓ |
| Max Operating Frequency | 66 MHz | ✓ | ✓ | ✓ |
| IO Count | 190 | ✓ | ✓ | ✓ |
| Power Consumption | 615.9 mW | ✗ | ✓ | ✓ |
|   Hard IP | 2.1 mW | | | |
|   IO | 282.0 mW | | | |
|   Clk | 331.8 mW | | | |
| Package | | | | |
|   QFP | | ✗ | ✗ | ✓ |
|   BGA | | ✗ | ✓ | ✓ |
| Development Schedule | | | | |
|   Engineering Sample Delivery (requirement) | | ✗ | Aug 3 2010 | Aug 3 2010 |
|   Estimated Clean File Required Date | | ✗ | Jun 30 2010 | Jul 4 2010 |

506
504
502

[Request for Price Quotation] [Save] [Return to Main Menu] [View Input]

Figure 8

Package (BGA)

| Type | #Pins | Pin Pitch | Body Size | Die_1 | Die_2 | Die_3 |
|------|-------|-----------|-----------|-------|-------|-------|
| BGA | 110 | 0.8 mm | 10 mm x 10 mm | ✗ | — | — |
| BGA | 140 | 0.8 mm | 12 mm x 12 mm | ✗ | ✗ | ✗ |
| BGA | 200 | 0.8 mm | 12 mm x 12 mm | ✗ | ✗ | ✗ |
| BGA | 240 | 0.8 mm | 15 mm x 15 mm | — | ✓ | ✓ |
| BGA | 280 | 0.8 mm | 18 mm x 18 mm | — | — | ✓ |
| BGA | 320 | 1.27 mm | 27 mm x 27 mm | — | — | ✓ |
| BGA | 410 | 1.0 mm | 27 mm x 27 mm | — | — | ✓ |

Close

METHOD AND SYSTEM FOR MAPPING MEMORY WHEN SELECTING AN ELECTRONIC PRODUCT

BACKGROUND

The invention is directed to an improved approach for selecting the appropriate product of uncommitted logic to use to implement an electronic design.

A modern integrated circuit (IC) has a large number of electronic components that are fabricated by forming layers of different materials and of different geometric shapes on various regions of a silicon wafer. Many modern IC designs are in the form of application-specific integrated circuits (ASICs), which are ICs that are customized for a particular use, rather than intended for general-purpose use.

The process to create and design the ASIC is normally a very expensive, complicated, and time-consuming endeavor. To design the ASIC, a designer typically first creates high level behavior descriptions of the IC device using a high-level hardware design language, which is then translated into netlists of various levels of abstraction using a computer synthesis process. At the physical level, the IC designer may then need to use a set of layout EDA application programs to create a physical integrated circuit design layout from a logical circuit design. The layout EDA application uses geometric shapes of different materials to create the various electrical components on an integrated circuit and to represent electronic and circuit IC components as geometric objects with varying shapes and sizes. After an integrated circuit designer has created an initial integrated circuit layout, the integrated circuit designer then verifies and optimizes the integrated circuit layout using a set of EDA testing and analysis tools. Verification may include, for example, design rule checking to verify compliance with rules established for various IC parameters. Many errors are inadvertently introduced into this process, at both the logical and physical design stages, and the process to correct these errors prior to tape-out could end up consuming a significant amount of time and expense.

In many cases, the expense of designing a custom ASIC is considered to be excessive if the number of units needed to be manufactured is relatively small. Moreover, there is often the need to configure an IC for test purposes, where the cost of creating a custom ASIC for testing is prohibitively expensive.

To address these issues, the electronics industry provides products containing uncommitted arrays of logic that can be configured to create customized circuits or custom logic arrays. For example, a gate array (GA) is a prefabricated silicon chip circuit in which transistors, devices, and/or standard gates (e.g., NAND/NOR gates) are placed at regular predefined positions on a wafer. Creation of a circuit with a specified function is accomplished by adding a final surface layer or layers of metal interconnects to the chips during the manufacturing process, which allows the final version of the chip to be customized by a customer.

A field programmable gate array (FPGA) is another type of an IC that includes an array of uncommitted gates which are designed to be configured by the customer or designer after manufacturing. FPGAs contain programmable logic components that allow the array elements to be wired or programmed together, without the need to fabricate the final surface layer of interconnects as required by the gate arrays.

The process to manufacture an electronic circuit can be immensely simplified by using one of these products, since the designer avoids the need of performing full physical design, verification, and manufacture of a custom IC. Instead, the physical platform provided by the GA or FPGA can simply be configured to interconnect the pre-manufactured gates into a custom connected pattern to implement the electronic design.

To use these types of products, an application circuit must be built on a product that has enough gates, wiring elements, I/O pins, and other necessary devices to implement the requirements of the expected electronic design. Since requirements vary among customers of these products, such products usually come in product families of standard sizes, with certain products having more available on-board gates and components and other products in the product family having less on-board gates components, where the smaller members of the family have less capacity but also being correspondingly less expensive. For example, a manufacturer may produce a line of different gate array or FPGA devices, with each product having a different gate count or number of memory components.

The difficulty for a customer of these products is to decide upon the specific product to employ to implement an electronic design. Using a device that has too few gates for the expected design will be fruitless, since it will not have sufficient capability to implement the electronic design. Using a product that has more gates than are needed for the design will be a waste because the customer will have purchased more capacity than is needed.

The conventional approach to this process is to manually make this selection and determination of the appropriate product to use to implement the electronic design. The manufacturer would distribute data sheets or other types of product description documents, which the customer would use to manually review in conjunction with the requirements of the electronic design. Alternatively, the customer could create a spreadsheet to hold data from the data sheets, which is again analyzed in a manual fashion to make the determination.

These manual approaches to product selection are fraught with possible errors and could consume an excessive amount of time. Moreover, the results achieved by such manual processes are often mere guesswork by the designer. To reduce the risk of selecting an inadequate product, this often causes the designer to select a product that has far more capacity than is ultimately needed at an obviously increased cost.

Therefore, there is a need for a more efficient approach to identify the specific product that is used to implement an electronic design, where the product includes an array of uncommitted gates.

SUMMARY

Some embodiments of the present invention provide an improved approach for analyzing and estimating products having arrays of uncommitted logic, and matching these products to electronic designs. Embodiments of the present invention can be applied to any type of product that include arrays of uncommitted logic, such as gate arrays and field programmable gate arrays. According to some embodiments, an improved approach is described for mapping memory requirements to the capabilities of a product having arrays of uncommitted logic.

Other additional objects, features, and advantages of the invention are described in the detailed description, figures, and claims.

BRIEF DESCRIPTION OF FIGURES

FIG. 5 shows an example user interface for displaying results of analyzing and selecting a product containing an array of uncommitted logic.

FIG. 8 shows an example user interface for displaying results of package selection analysis.

DETAILED DESCRIPTION

Embodiments of the present invention provide improved methods and systems for identifying suitable platforms and products of arrays of uncommitted logic that can be used to implement an electronic design. Such arrays of uncommitted logic include for example, gate arrays and field programmable gate arrays. The following description and examples will be illustratively described with respect to gate arrays. It is noted, however, that the present invention may be implemented using any suitable type of product or device having arrays of uncommitted logic, and the invention is therefore not to be limited in its application to gate arrays unless explicitly claimed as such.

Figure 1:
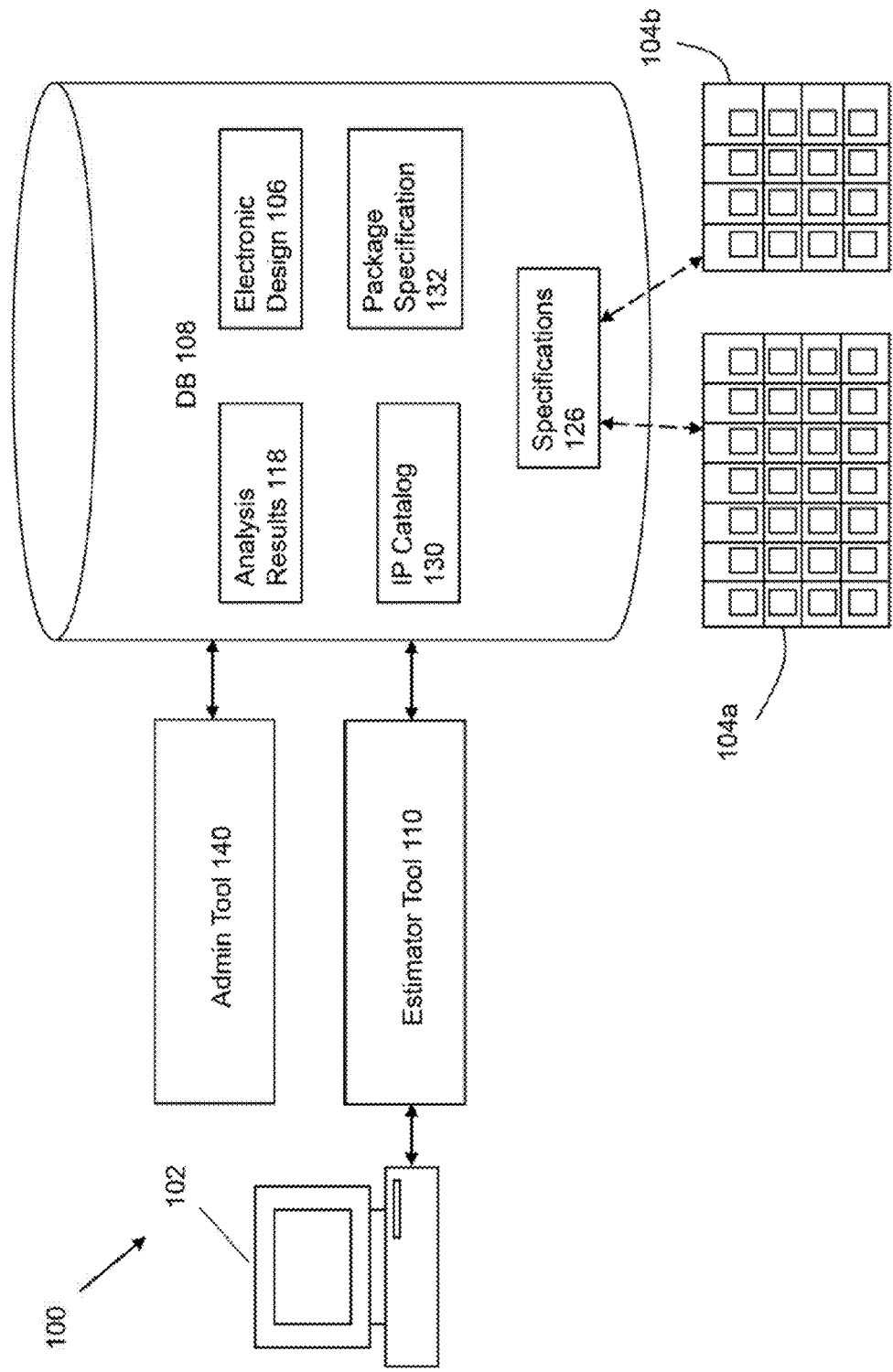
FIG. 1 depicts an architecture of a system for analyzing and selecting a product containing an array of uncommitted logic.

FIG. 1 shows an architecture of a system 100 for matching electronic designs 106 to products having arrays of uncommitted logic according to some embodiments of the invention. System 100 comprises one or more users at one or more user stations 102 that access an estimator tool 110 to identify the one or more GA products 104a and/or 104b that are suitable to implement the design specifications for an electronic design 106. The different possible GA products 104a and 104b correspond to GA products that have different sizes, capabilities, and components levels. Each product corresponds to an unique die or chip configuration (hereinafter referred to illustratively as a "GA die"). For example, GA product 104a may correspond to a GA die that has a relatively large number of available logic gates and GA product 104b may correspond to a GA die that has a relatively small number of available logic gates. While FIG. 1 only illustrates two example GA dies 104a and 104b, it is noted that system 100 may be configured to handle any number of GA dies that have different capabilities and/or sizes. Indeed, the system 100 may be implemented to simultaneously match the electronic design 106 to different types of products, such that 104a corresponds to a GA product while 104b corresponds to a FPGA product.

The users at user station 102 correspond to any individual, organization, or other entity that uses system 100 for performing GA estimation and matching tasks with respect to electronic design 106. The use stations 102 could be implemented using any suitable platform. For example, user station 102 may be implemented as a remote workstation networked to the tool 110 across the internet, where the data from the tool 110 is configured and displayed using a web browser.

The user station 102 may be associated with a database 108 or other computer readable medium that holds a data regarding the electronic design 106 and/or results 118 of performing GA product estimation. The database 108 may also contain one or more specifications 126 relating to the GA dies 104a and 104b. The one or more specifications 126 comprise any set of information or parameters that is needed or used to match the requirements of the electronic design 106 to the GA dies 104a and 104b. For example, the specification could include details regarding the number of configurable gates, amount of onboard memory, I/O capabilities, and power capabilities for each product.

The database 108 may also include package specifications 132 for packages that may be used to implement the GA dies 104a/104b as IC products. For example, package specifications 132 may include the details of BGA (Ball Grid Array) packages that are suitable to be used with GA dies 104a or 104b. The database 108 may additionally include information about other types of electronic designs or components that may be used in conjunction with the GA dies 104a and 104b. For example, a library or catalog 130 of soft IP blocks may be stored within database 108, or may be externally accessible by the GA estimator tool 110, where the IP catalog 130 comprises a listing of the IP blocks that may be used within the electronic design 106. As used herein, "IP" refers to the term "intellectual property" as used with respect to re-usable units of electronic design.

An administrative tool 140 may be used to input and maintain the information within database 108, such as the GA specifications 126, package specifications 132, and IP catalog 130. According to some embodiments, the administrative tool 140 is used by the manufacturer or vendor of the GA products to provide the information into the database 108. Customers at user station 102 would then use the GA estimator tool 110 to identify the specific products being sold by the manufacturer or vendor which can be used to implement the customer's electronic design 106. The GA estimator tool 110 accesses the database 108 to analyze the specifications of the electronic design 106 to identify the one or more GA products 104a and/or 104b that are capable or implementing the electronic design 106.

Figure 2:
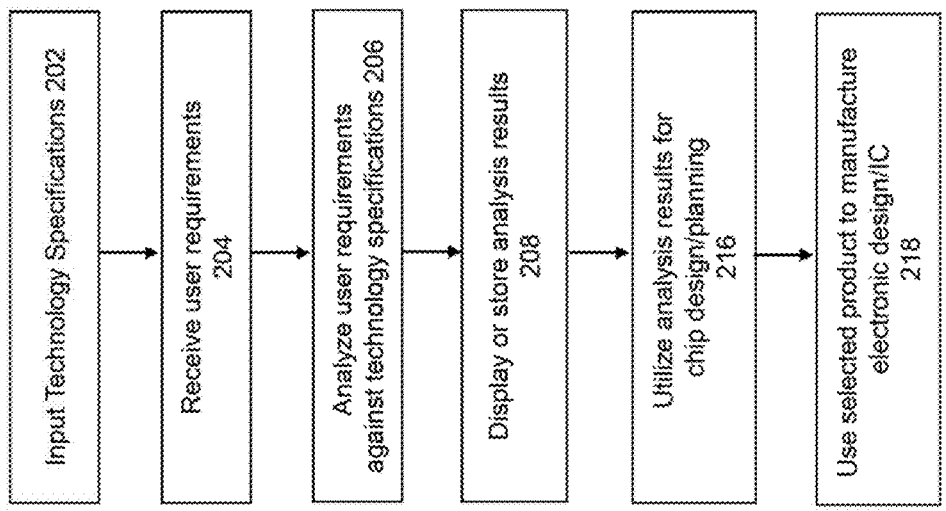
FIG. 2 shows a flowchart of an approach for analyzing and selecting a product containing an array of uncommitted logic.

FIG. 2 shows a high level flowchart of actions that are taken by system 100 to perform GA estimation operations. At 202, the manufacturer or vendor of the logic array products provides detailed specifications for the products to a database. An administration tool may be employed by the manufacturer or vendor to provide this information into the database. The administration tool may also be used to maintain or update the information regarding the available GA dies in the database.

For example, for each GA die available for purchase, the manufacturer or vendor would provide the number of logic gates available on each GA die. In addition, the technical specifications would include the type and quantity of hard IP located on each die, e.g., the number and type of PLLs, voltage regulators, and other IP implementing a dedicated function, on each die.

The technical specifications may also include information about the I/O capabilities for each GA die, such as the I/O count for the dies. The max operating frequency for the available GA dies may also be specified in the specifications.

Available package types may also be specified for the GA dies, such as available BGA, QFP, or other package types. Power consumption information may be provided as well, particular in combination with the different packages to indicate the possible power consumption/dissipation capabilities for the different die and package combinations, also with respect to the various I/O, hard IP, and clock options.

In operation, at 204, the system would receive a set of user requirements for the electronic design. Any suitable set of requirements parameters may be employed to input details of the expected electronic design. Such requirements could include, for example, the expected number of logic gates in the electronic design, as well as the type of required logic gates (e.g., 2-input NAND gates).

In addition, the user may specify the number of memory elements required in the design. For example, the user may specify the number of bits of single-port and dual-port memory needed to implement the design. The user requirements may also include clock specifications, I/O specifications, and required package types.

The user may also specify the quantity and types of hard IP needed in the design, such as PLL, voltage regulators, and special purpose I/Os. The user may also specify one or more types of soft IPs to be included in the design. According to one embodiment, the user has access to a catalog of soft IP blocks stored in the database accessible to the GA estimator tool. In some embodiments, the system may be linked to an external catalog of IP blocks that may be purchased or utilized in the electronic design, e.g., as described in co-pending U.S. application Ser. No. 12/252,577, filed Oct. 16, 2008, entitled "METHOD AND SYSTEM IDENTIFYING AND LOCATING IP BLOCKS AND BLOCK SUPPLIERS FOR AN ELECTRONIC DESIGN", which is hereby incorporated by reference in its entirety.

Once the user requirements have been entered, then at 206, the GA estimator tool will analyze the user requirements against the technology specifications in the database to identify the one or more GA dies which are suitable for the electronic design. Further details regarding a process for performing this analysis is described in further detail below.

At 208, the analysis results are displayed to the user on a display device and/or are stored in a computer readable storage medium. The analysis results can then be used at 216 to select a GA die for chip design or planning purposes. After the appropriate GA die has been selected, then at 218, the selected GA die can be used to manufacture an IC product that incorporates the electronic design.

Figure 3:
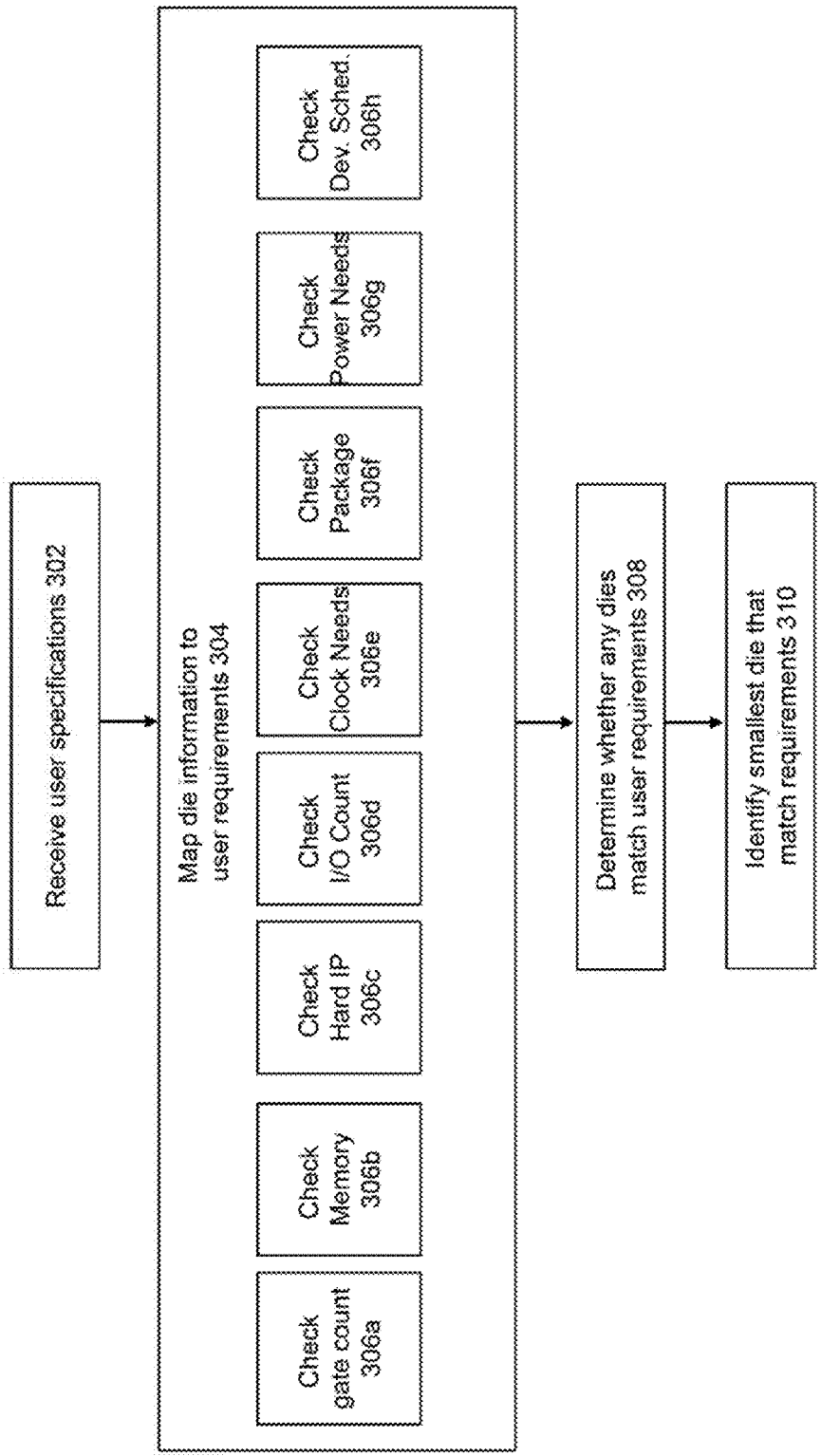
FIG. 3 shows a flowchart of an approach for analyzing requirements of an electronic design and matching the requirements to a product containing an array of uncommitted logic.

FIG. 3 shows a flowchart of an approach for analyzing user requirements to identify the one or more GA dies which are suitable for the electronic design. At 302, the user requirements are received, as described above. Next, at 304, the user requirements are mapped against the specification information that had previously been recorded for each GA die that is available for purchase. Any suitable set of die information can be mapped against the user requirements to determine which, if any, of the available dies can be used to implement the electronic design.

FIG. 3 shows examples of some of the types of information that can be analyzed in 304. For example, at 306a, the number of logic gates available in each GA die is checked against the number of required gates that has been identified by the user. If the number of required logic gates is greater than the number of available logic gates for a GA die, then the GA die is not a suitable platform for the user's electronic design.

In some embodiments, this analysis is not simply a comparison between the user-required number of logic gates and the number of available logic gates specified for the GA die. Instead, the analysis must also analyze additional logic gate overheads that should be taken into account which will reduce the number of available logic gates in the GA die. This is because it can be expected that some reasonable number of logic gates will need to be consumed during the later parts of the development process to ensure the usability and functionality of the design. For example, during the process of performing timing closure, it can be expected that some percentage of logic gates will be needed ensure that the electronic design will meet timing requirements. Therefore, a certain percentage of the logic gates may be set aside for such overhead, thereby reducing the actual number for logic gates available to the user. This set-aside of logic gates as overhead may be a fixed percentage of the logic gates (e.g., 10%) or it may be a variable percentage that is dependent upon design factors or environmental conditions. For example, there may be clock frequency dependencies, where a user design at higher clock frequencies will cause a greater percentage of logic gate overhead than a design at lower clock frequencies. As another example, clock tree overhead for the logic gates may also be frequency-dependent. There may also be a number of logic gates that need to be set aside to implement testing logic.

At 306b, the memory requirements are mapped against the physically available memory resources to determine whether any of the GA dies are capable of supporting the memory requirements. This process is explained in further detail below.

At 306c, the hard IP requirements for the electronic design are checked against the die specifications. In some embodiments, this action merely matched up the list of hard IP elements for each die with respect to the required hard IP requirements to see if any of the GA die has all of the required hard IP components. For example, the user requirements may specify the need for one PLL and one voltage regulator. If a given GA die does not have at least one PLL and at least one voltage regulator, then that GA die cannot meet the user requirements.

At 306d, the required number of I/Os specified for the electronic design is checked against the number of I/Os available for the GA dies. As with the hard IP requirements, this action merely matched up the specified number of I/Os needed for the design against the number of I/Os available on the GA die. If a given GA die does not have a sufficient number of I/Os, then that GA die cannot meet the user requirements. In some embodiments, consideration of the requirement for I/Os for FPGAs and GAs is not simply based upon analysis of the number of I/Os, but also takes into account the different types of I/Os that must be present in the product, e.g. to determine if a sufficient number of SSTL type I/Os or LVCMOS type I/Os are present in the FPGA or GA product. The same process as above applies, but is more involved since not having enough of any one type of I/O can make a particular offering unusable for a given user-requirement.

At 306e, the clock and frequency requirements for the electronic design are checked against the specifications for the GA dies. In some embodiments, this analysis action will determine whether the user specified frequency levels (1) achievable, (2) not achievable, or (3) possibly achievable. Achievable frequencies are those user-specified frequencies for the electronic design that are within a given "safe" threshold range or level are specified by the manufacturer or vendor in the technology specifications for the GA dies. Not-achievable frequencies are the frequencies that exceed a specified "unsafe" threshold range or level as identified by the manufacturer or vendor in the technology specifications for the GA dies. Possibly-achievable frequencies are the frequencies that fall within a range identified by the manufacturer which may be possible to implement, but which may require additional configuration or manufacturing work in order to be achievable. This category may affect the analysis of other factors, such as the development schedule factor of 306h or the NRE (non-recurring engineering) cost of the design At 306f, the user-specified package type is analyzed to see if there are any of the specified package types that are available in conjunction with GA dies that meet the other user requirements. For example, the pin counts and power requirements of the electronic design are checked by looking at the GA dies in conjunction with the package types. If the user does not specify a desired package type, then in some embodiments, the analysis is performed against all available package types.

At 306g, power requirements for the electronic design are analyzed to determine which of the GA dies are capable of handling the power requirements for the design. In some embodiments, this analysis action is performed by calculating the total power consumption expected for the electronic design, and checking that expected power consumption to see if there are any die/package combinations with power/thermal dissipation properties that can handle the power requirements. This analysis is performed by looking at the expected ambient temperature and maximum junction temperature in conjunction with the expected power consumption, and determining whether the thermal resistance of the die/package combination is sufficient for those power consumption levels. Other embodiments could include optional inclusion of additional components (such as heatsinks or external fans) in the analysis, which essentially provides a trade-off of the cost relative to reduced thermal resistance.

At 306h, manufacturing and development schedules can be analyzed for the electronic design. This analysis determines the expected delivery dates to produce a GA product based upon the selected GA dies. This analysis can also be used to identify the required lead time to provide detailed design data in order achieve the excepted deliver dates. The analysis of the expected delivery date and required lead times is based upon scheduling information provided by the manufacturer or vendor. The delivery date and/or required lead time may be increased based upon certain design parameters or environmental conditions, e.g., the delivery dates may be an extended time date range if the clock frequency falls within the "possible achievable" level but is a shortened date range if the clock frequency falls within the "achievable" level.

At 308, a determination is made whether there are any GA dies that meet or exceed the user requirements. If so, then the system will identify the GA dies that are suitable for the user design. If there are multiple GA dies which meet or exceed the user requirements, then in some embodiments at 310, the best match is identified to the user. In some embodiments, the die which is either the smallest (in terms of gate count) or the least expensive which meet the user requirements is considered the "best" match.

Figure 4:
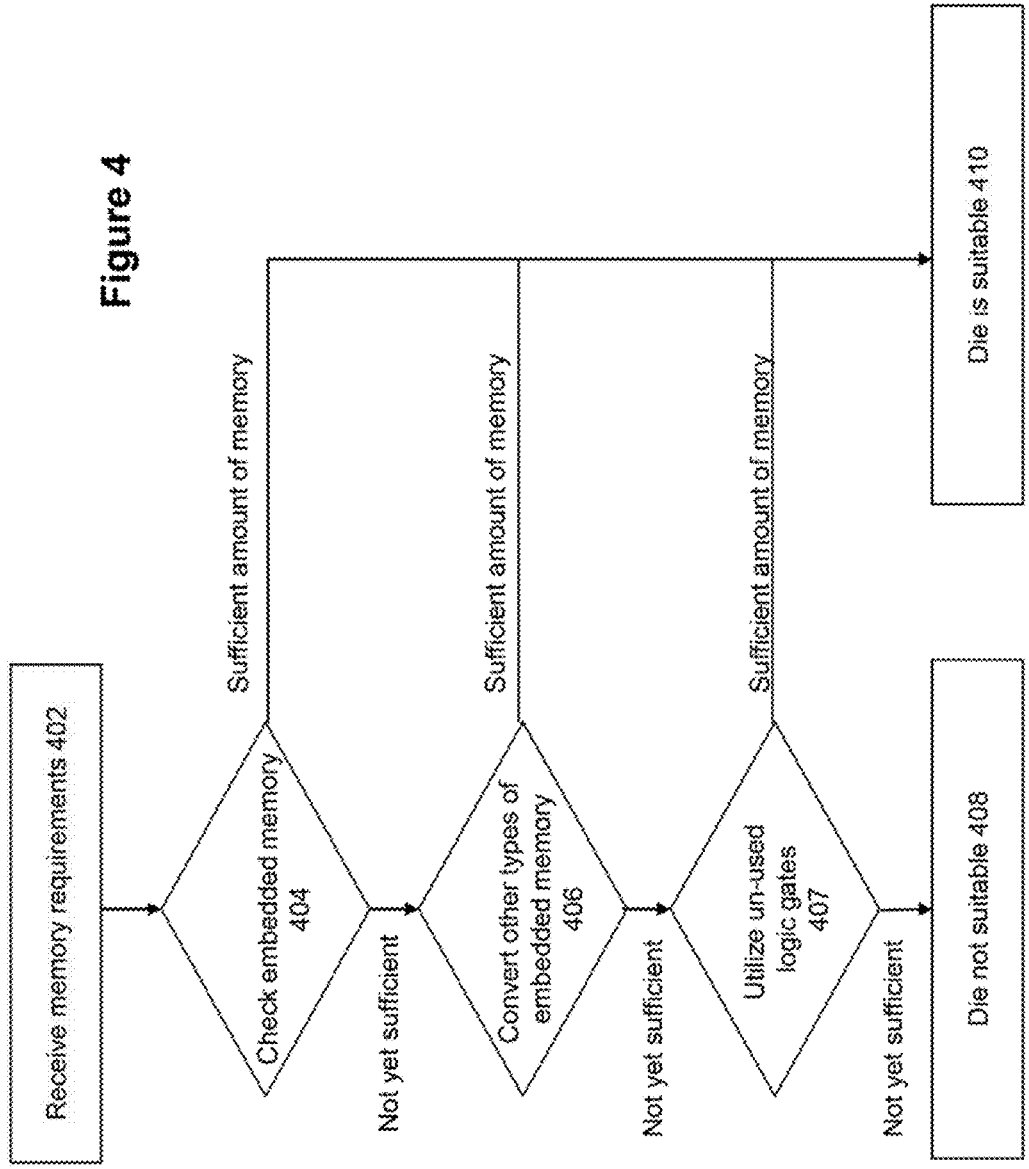
FIG. 4 shows a flowchart of an approach for performing memory mapping.

FIG. 4 shows a flowchart of an approach for performing memory mapping to determine whether any of the GA dies can meet the electronic design's memory requirements. This aspect of the invention essentially performs a mapping of the user's logical memory requirements to the physical capabilities and structures of the GA dies. The intent is to determine whether the memory requirements of the electronic design can be implemented using any of the available GA dies.

At 402, the memory requirements for the electronic design are received. According to some embodiments of the invention, this action is performed by having the user input the number of bits of single-port and dual-port memory that is needed for the electronic design.

At 404, the first action is to determine the sufficiency of the embedded memory in the available GA dies, where the embedded memory refers to the built-in memory that is designed into the GA die. This action is separately performed for each type of embedded memory in the GA die. For example, if the user requirements are for 150000 bits of single-port memory, then each of the eligible GA dies are checked to see if the GA die has 150000 bits of available embedded single-port memory. Similarly, if the user requirements are for 150000 bits of dual-port memory, then each of the eligible GA dies are checked to see if the GA die has 150000 bits of available embedded dual-port memory.

According to some embodiments, the amount of available embedded memory may be subject to reduction based upon certain types of memory overhead. For example, such overhead may exist if there is a mismatch between designated word lengths of the GA dies and the word lengths expected to be employed in the electronic design. To explain, it is possible that the manufacturer of the GA dies will specify certain standard word lengths of a given number of bits per word. For instance, assume that a GA die has a total of 65,536 bits of memory that is have the following possible word configurations:

| Words | Bits/Word |
|-------|-----------|
| 4056  | 16        |
| 2048  | 32        |
| 1024  | 64        |
| 8192  | 8         |

The problem is that the user's electronic design may utilize word lengths that do not correspond to these configured word lengths. If the user's design requires word lengths of 14 bits per word, then the design will be implemented using the word length of 16 bits/word. This means that there will be two wasted bits for every word. The sum total of these wasted bits corresponds to memory overhead that will be taken into account where determining the amount of available embedded memory in the GA die.

There may also be additional memory bits that have to be accounted for as overhead based upon other factors in either the GA die or the user design. For example, there may be testing structures or BIST structures that correspond to additional bits to be considered as memory overhead. In alternate embodiments, embedded RAM could have redundancy capability, which may also reduce the number of "available" bits to the user.

Therefore, 404 corresponds to the action of determining whether the total embedded memory bits minus the memory overhead bits either meets or exceeds the user's memory requirements. If it is determined that the amount of embedded memory meets or exceeds the user's memory requirements, then an indication is made at 410 that the GA die is suitable to satisfy the memory requirements.

If it is determined that the amount of available embedded memory is not yet sufficient to satisfy the memory requirements, then at 406, an inquiry is made whether other types of embedded memory can be used to satisfy the memory requirements. To explain, consider the example situation in which the design requirements specify more single-port memory than is provided by the embedded single-port memory of the GA die. However, the design requirements also use less dual-port memory than is available as embedded dual-port memory in the GA die. In this situation, it can be seen that there is an excess of embedded dual-port memory, and that the excess embedded dual-port memory can be used to satisfy at least some of the requirements for the single-port memory.

Therefore, 406 corresponds to the action of determining whether the combination of the total embedded memory for the required memory type plus any excess embedded memory of other memory types (minus the memory overhead bits)

either meets or exceeds the user's memory requirements. If it is determined that the amount of embedded memory meets or exceeds the user's memory requirements, then an indication is made at 410 that the GA die is suitable to satisfy the memory requirements.

If it is determined at 406 that the amount of available embedded memory is not yet sufficient to satisfy the memory requirements, then at 407, an inquiry is made whether excess logic gates can be used to satisfy the memory requirements. After taking into account the specified logic gate requirements needed to implement the electronic design (including the logic gate amounts specified by the user, the gates needed to implement the soft IP, and any types of logic gate overhead that needs to be considered), it is possible that there are extra logic gates that can be used to implement the required memory.

According to some embodiments, as part of the initial set of technology information provided by the manufacturer, the information will include an indication of the number of gates that is needed to implement different types of memory. For example, it is possible that a manufacturer may specify that 2000 gates would be needed to implement a single-port 1RW memory of 256 bits or that 5600 gates would be needed to implement dual-port 1RW1R memory of 512 bits.

Therefore, 407 corresponds to the action of determining there exists sufficient excess logic gates to implement the required memory that is not already accounted for by the combination of the total embedded memory for the required memory type plus any excess embedded memory of other memory types (minus the memory overhead bits). If it is determined that the amount of available memory meets or exceeds the user's memory requirements, then an indication is made at 410 that the GA die is suitable to satisfy the memory requirements. If, however, the memory based upon embedded memory and logic gates is not sufficient, then an indication is made at 408 that the GA die is not suitable.

FIGS. 5 to 8 illustrate example user interfaces that may be used in some embodiments of the invention.

FIG. 5 illustrates an interface for presenting detailed results of analyzing the user's design requirements against the specification information for the available GA dies. The interface shows the requirements as provided by the user for the number of logic gates, memory bits (single-port and dual-port), hard IP, maximum operating frequency, I/O counts, power consumption, package selection, and development schedule.

Each column 502 on the right-hand side of the figures corresponds to a different available GA die, and shows the results of the analysis for these categories of requirements for that GA die. A check symbol 504 (e.g., in a green color) denotes that the GA die is a suitable candidate for a given category of the requirements. A "X" symbol 506 (e.g., in a red color) denotes that the GA die does not satisfy the indicated category of requirements. According to the illustrated embodiment, if there is a single "X" symbol for a GA die, this means that the GA die is not a suitable candidate for the electronic design.

In this example, it can be seen that the Die_1 is not a suitable candidate since this die corresponds to multiple "X" symbols for different categories of requirements, which means there are multiple categories of components that are not suitable in this die to implement the electronic design. However, both Die_2 and Die_3 are suitable candidates since each of these dies correspond to check symbols for all categories, which means that each category of component meets or exceeds the user's requirements. The Die_2 is highlighted to indicate that this is the preferred die for the user's requirements, since this is the smallest die that meets all of the user's requirements.

Figure 6:
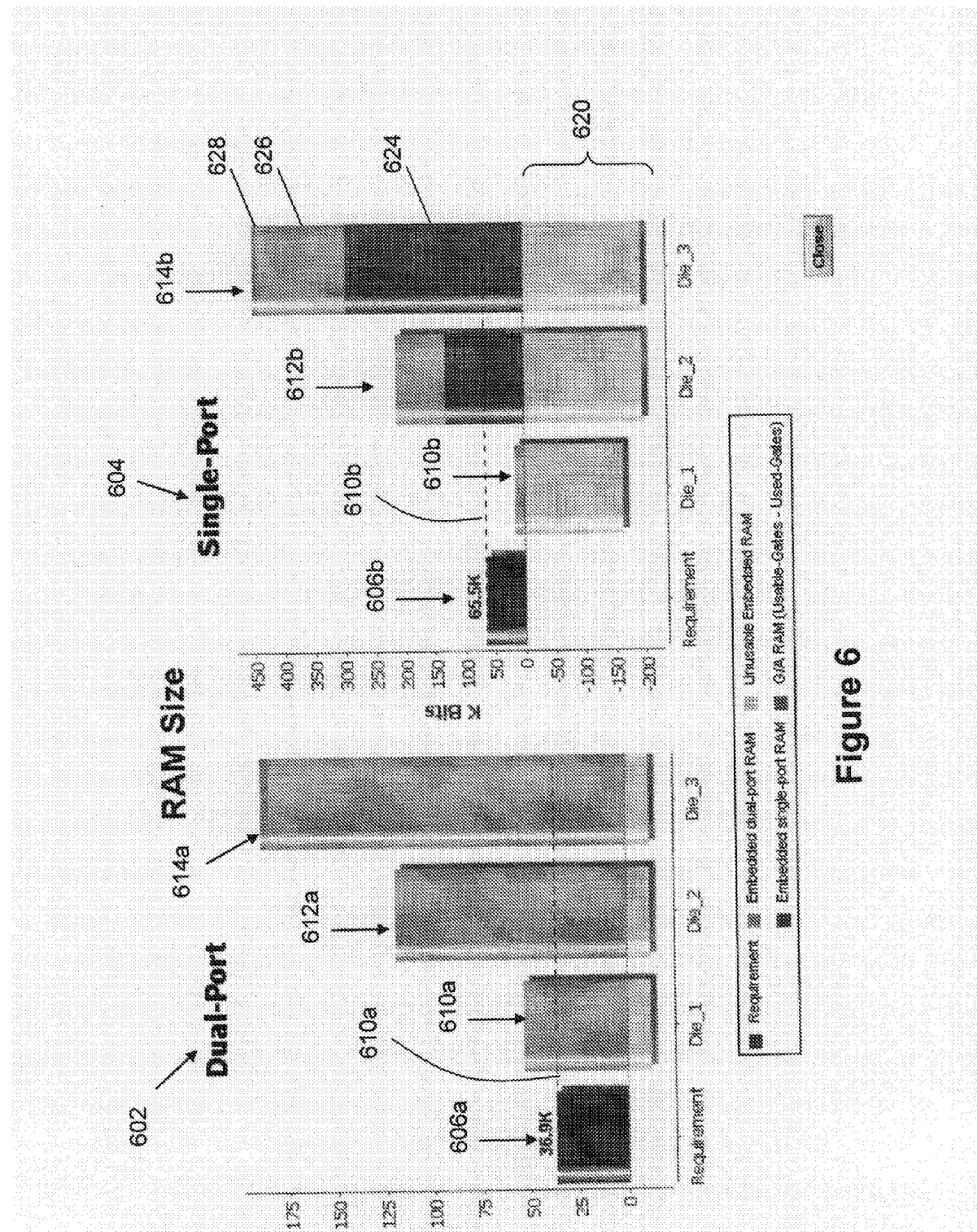
FIG. 6 shows an example user interface for displaying results of performing memory mapping.

Each of these categories can be highlighted to drill-down to the details of the analysis. For example, FIG. 6 is an example of an interface that can be used to display the details of the memory mapping analysis for each die. This interface includes a separate chart for each type of memory being analyzed, e.g., dual-port memory chart 602 on the left and single-port memory chart 604 on the right.

The Y-axis of each chart corresponds to the number of memory bits, with the left-most bars 606a and 606b in the chart being the user's memory requirements for the electronic design. The dashed horizontal lines 608a and 608b stretching from the top of this first bars 606a and 606b, respectively, provide a visual indicator of the minimum amount of memory that each die must possess to meet the memory requirements. Each die must at least meet this height to be a suitable die.

The other bars correspond to the different available dies (Die_1, Die_2, and Die_3) that were analyzed, i.e., bar 610a for Die_1, 612a for Die_2, and 614a for Die_3 for the dual-port memory analysis and bar 610b for Die_1, 612b for Die_2, and 614b for Die_3 for the single-port memory analysis. Each bar for a die includes different portions for the different types of memory that go into the analysis. A different visual indicator can be used to separate the different type of memory, e.g., using different colors, shadings, or patterns. The portions 620 beneath the "0" value corresponds to unusable embedded memory, e.g., bits consumed by memory overhead or unusable bits in the words. The first portion 624 of each bar corresponds to the available embedded memory for that given memory type. The next portion 626 of each bar corresponds to the available memory of other memory types. The final portion 628 of each bar corresponds to the memory that can be implemented using un-used logic gates.

Therefore, it can be seen that Die_1 does not meet the memory requirements, since bar 610b for Die_1 does not reach to the height of the dashed line 608b (even though Die_1 does meet the requirements for dual-port memory as shown by the height of bar 610a exceeding the dashed line 608a). However, the bars 612a/b and 614a/b for dies Die_2 and Die_3 both exceed the dashed lines 608a and 608b, giving an instant visual confirmation that both of these dies satisfy the memory requirements.

This type of user interface is very useful since it provides an instant visual indicator of the suitability of a given die. This approach is very intuitive and gives the ability to immediately identify the components of a die which provide for the elements to satisfy the user requirements.

Figure 7:
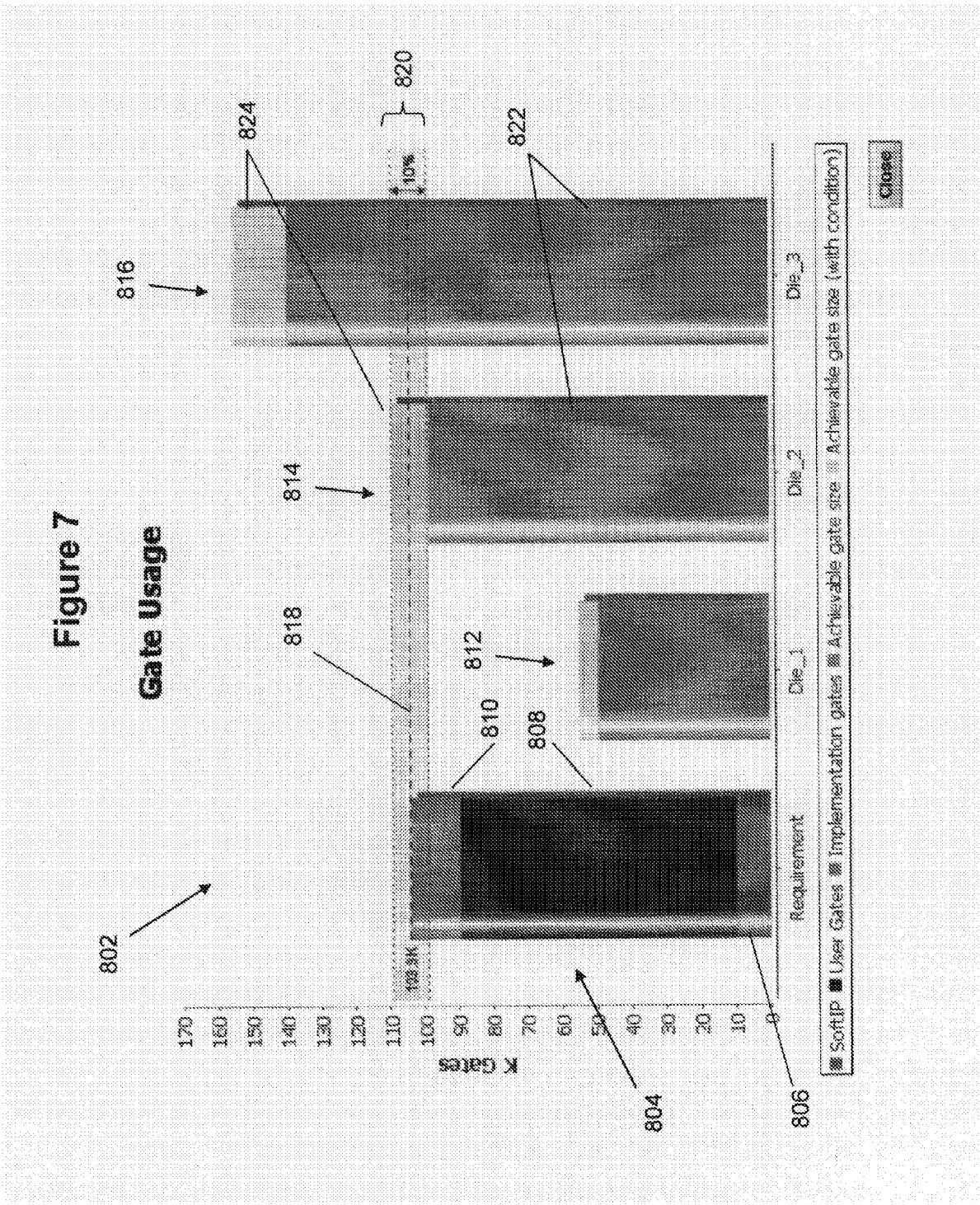
FIG. 7 shows an example user interface for displaying results of gate usage analysis.

A similar interface can be used to display the analysis results for the other categories of the user requirements. For example, FIG. 7 illustrates an example of an interface that can be used to display the details of the logic gate analysis for each die. As before, a chart 802 is used to visually display the results of the analysis. The Y-axis of the chart 802 corresponds to the number of gates, with the left-most bar 804 in the chart 802 being the user's specified logic gate requirements for the electronic design. According to the present embodiment, bar 804 is constructed by accounting for the number of gates required to implement the specified number of logic gates, as well accounting for the gates needed to implement soft IP and implementation overhead. Section 808 of the bar 804 corresponds to the number of logic gates specified by the user as being required for the electronic design. Section 806 of the bar 804 corresponds to the number of logic gates needed to implement the soft IP. Section 810 of the bar 804 corresponds to the number of gates needed to account for implementation overhead. Such implementation overhead is based upon, for example, extra gates needed to implement timing closure and testing structures.

The sum of the sections 806, 808, and 810 corresponds to the number of logic gates needed to implement the electronic design. The dashed horizontal line 818 stretching from the top of bar 804 provides a visual indicator of the minimum number of logic gates that each die must possess to meet the logic gate requirements. Each die must at least meet this height to be a suitable die. In some embodiments, a range 820 can be constructed around the dashed line 818, to indicate that a range of logic gate quantities may be considered for purposed of suitability of a die for the analyzed parameters. In the present example, the range 820 is configured to provide a 10% window of suitability for dies in the gate analysis.

The other bars correspond to the different available dies (Die_1, Die_2, and Die_3) that were analyzed, i.e., bar 812 for Die_1, 814 for Die_2, and 816 for Die_3. Each bar for a die is composed of two sections. One section 822 corresponds to the unconditional number of gates that are achievable by a given die. Another section 824 of the bars identifies the number of gates that are conditionally achievable for a given die. Such additional gates may be available on a die by performing specialized or custom configurations of the die, although such additional gates may be achievable by also having to incur additional penalties or design trade-offs. In addition, such dies may also need to have extended delivery schedules and require earlier design submissions to the manufacturer.

A different visual indicator can be used to separate the different type of logic gate categories that make up each section of the bars. Such visual indicators an be in the form of different colors, patterns, or shadings.

In the example of FIG. 7, it can be seen that Die_1 does not meet the gate count requirements, since bar 812 for Die_1 does not reach to the height of the dashed line 818 (or even the extended range 820 surrounding dashed line 818). However, the bars 814 and 816 for dies Die_2 and Die_3, respectively, both exceed the dashed line 818, giving an instant visual confirmation that both of these dies satisfy the logic gate requirements.

For Die_2, the bar 814 only exceeds the height of line 818 because of the excess gate counts that are 824 that are conditionally achievable. This result is instantly visible and recognizable based upon the fact that bar 814 includes two visually distinct sections 822 and 824, where it is the portion 824 that allows bar 814 to exceed the height of line 818. Therefore, the user can immediately understand the reason that Die_2 has been found to include enough logic gates, and can decide whether or not the die is acceptable given the possible trade-offs that may need to exist to make or configure Die_2 to include a sufficient number of logic gates to meet the design requirements.

It can also be visually seen that Die_3 is unconditionally able to meet the gate count requirement, since the section 822 of bar 816 is enough by itself to exceed the height of line 818. Therefore, there is no need to rely upon conditionally achievable gates as identified by section 824 to make Die_3 have enough logic gates to meet the design requirements.

FIG. 8 illustrates another example interface that can be used to display the details of a package analysis for the dies. The example interface shown in FIG. 8 shows the results of performing analysis for available combinations of the different dies with the different available BGA packages.

Each row of the interface table corresponds to a different package type. The details of each package type are shown in columns 840, 842, 844, and 846 of the row. Column 840 identifies the type of package (e.g., BGA type). Column 842 identifies the numbers of pins for the package. Column 844 identifies the pin pitch for the package. Column 846 identifies the body size for the package.

Columns 848, 850, and 852 represent the available dies that were analyzed. In the present example, column 848 corresponds to Die_1, column 850 corresponds to Die_2, and column 852 corresponds to Die_3.

The suitability of the package/die combinations are visually indicated in these columns. A check mark indicates that the identified package/die combination is suitable to implement the electronic design. For example, the package in row 860 in combination with Die_3 forms a combination that is suitable to implement the design, as indicated by check mark 854.

A "X" mark indicates that the identified package/die combination is not a suitable combination to implement the design. For example, the package in row 862 in combination with Die_2 forms a combination that is not suitable to implement the design, as indicated by X mark 856.

A dash mark indicated that the identified package/die combination is not an available combination. For example, the dash mark 858 indicates that the combination of the package of row 860 cannot be combined with Die_1.

Visual indicators can be used to easily allow these different types of marks to be distinguished from one another. For example, color codings can be used to differentiate these marks, e.g., by making the check mark green in color, the X mark red in color, and the dash mark yellow in color.

The above described example interfaces may be used to implement drill-down details for any of the parameters that are analyzed to select a die. Of course it is understood that other an additional types of user interfaces may be used in combination with the various embodiments of the invention.

Therefore, what has been described is an improved approach for analyzing and estimating products having arrays of uncommitted logic, and matching these products to electronic designs. The present invention can be applied to any type of product that include arrays of uncommitted logic, such as gate arrays and field programmable gate arrays.

System Architecture Overview

Figure 9:
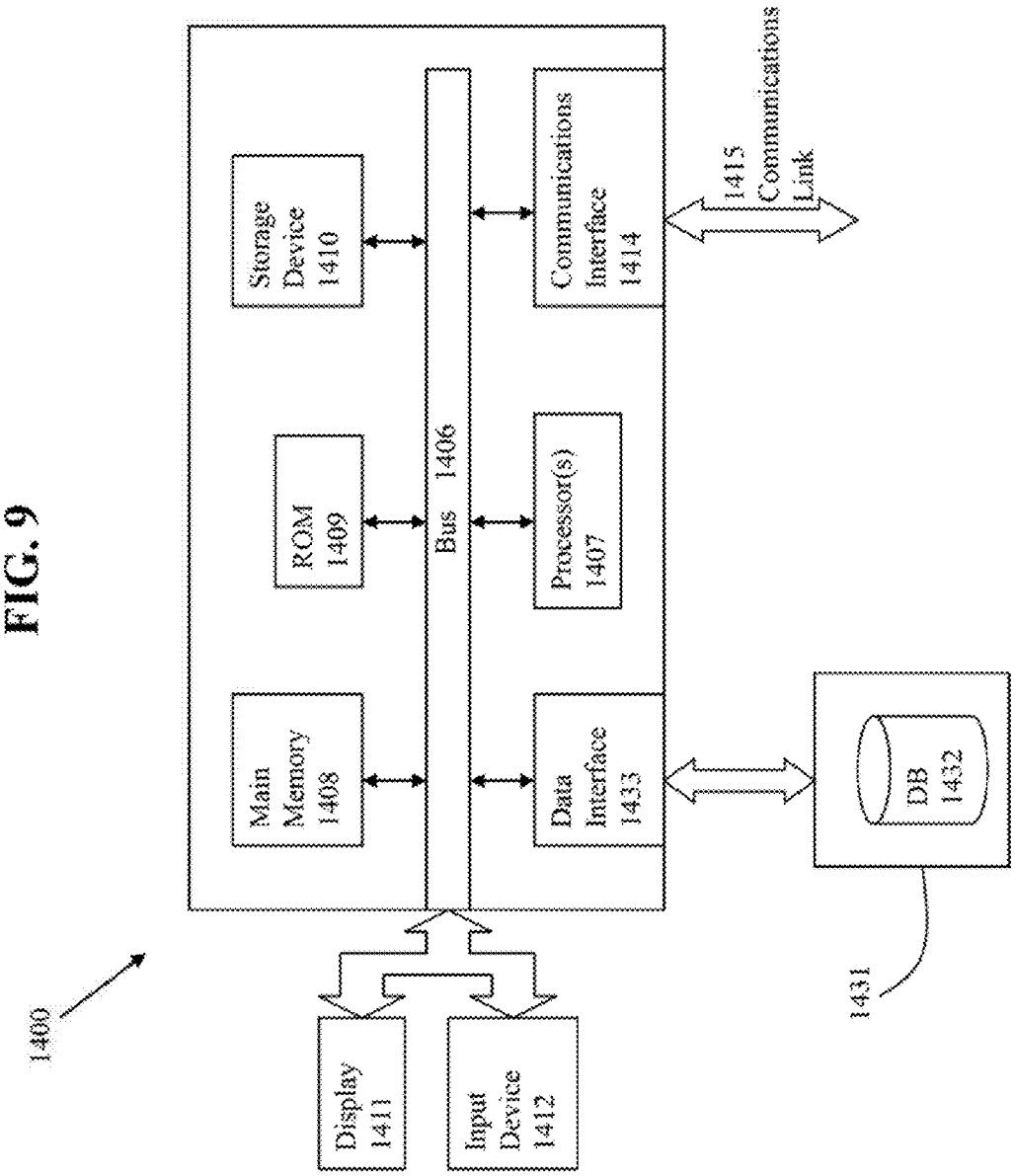
FIG. 9 shows an architecture of an example computing system with which the invention may be implemented.

FIG. 9 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A method implemented with a processor for mapping memory requirements for an electronic design to an electronic product having an array of uncommitted logic, comprising:
   identifying memory requirements for an electronic design, wherein the memory requirements comprises a requirement for an amount of memory of a first memory type;
   determining whether the electronic product has a sufficient quantity of the first memory type that is embedded in the electronic product;
   determining whether the electronic product has a second memory type or uncommitted logic gates, which are embedded in the electronic product and are needed to meet the memory requirements; and
   identifying or determining whether the electronic product having the embedded memory supports the memory requirements for the electronic design, wherein a design of the electronic product is not included in the electronic design when the electronic product is determined not to support the memory requirements; and
   displaying results of identifying whether the electronic product supports the memory requirements for the electronic design or storing the results in another non-transitory compute readable storage medium.

2. The method of claim 1 in which the first and second memory types comprise dual-port memory and single port memory.

3. The method of claim 1 in which the electronic product having the array of uncommitted logic comprises a FPGA or GA.

4. The method of claim 1 in which the act of determining if the embedded memory on the electronic product contains the sufficient quantity of the first memory type takes into account memory overhead.

5. The method of claim 4 in which the memory overhead comprises memory lost to a word length mismatch or test structures.

6. The method of claim 1 in which the act of determining whether the second memory type or uncommitted logic gates are needed to form the sufficient quantity of the first memory type is performed by identifying logic gates that are not needed to implement the electronic design.

7. The method of claim 6 in which a technology specification provided by a manufacturer of the electronic product is checked to determine how many of the logic gates are needed implement a quantity of the first memory type.

8. The method of claim 1 in which the act of determining whether the second memory type or uncommitted logic gates are needed to form the sufficient quantity of the first memory type is performed by identifying a quantity of the second memory type that is not needed to satisfy specified requirements for the second memory type.

9. The method of claim 1 in which a user interface is used to display the results, wherein the user interface comprises a bar chart having a separate bar for each electronic product being analyzed, wherein the bar chart provides a visual indicator of whether the electronic product having the array of uncommitted logic is capable of supporting the memory requirements for the electronic design.

10. The method of claim 9 in which bars in the bar chart comprise different sections to represent different memory components, where a first section represents the first memory type, a second section represents the second memory type, and third section represents logic gates.

11. A computer program product that includes a non-transitory computer readable storage medium, the computer readable medium comprising a plurality of computer instructions which, when executed by a processor, cause the processor to execute a process for mapping memory requirements for an electronic design to an electronic product having an array of uncommitted logic, the process comprising:
    identifying memory requirements for an electronic design, wherein the memory requirements comprises a requirement for an amount of memory of a first memory type;
    determining whether the electronic product has a sufficient quantity of the first memory type that is embedded in the electronic product;
    determining whether the electronic product has a second memory type or uncommitted logic gates, which are embedded in the electronic product and are needed to meet the memory requirements;
    identifying or determine whether the electronic product having the embedded memory supports the memory requirements for the electronic design, wherein a design of the electronic product is not included in the electronic design when the electronic product is determined not to support the memory requirements; and
    displaying results of identifying whether the electronic product supports the memory requirements for the electronic design or storing the results in another non-transitory compute readable storage medium.

12. The computer program product of claim 11 in which the first and second memory types comprise dual-port memory and single port memory.

13. The computer program product of claim 11 in which the electronic product having the array of uncommitted logic comprises a FPGA or GA.

14. The computer program product of claim 11 in which the act of determining if the embedded memory on the electronic product contains the sufficient quantity of the first memory type takes into account memory overhead.

15. The computer program product of claim 14 in which the memory overhead comprises memory lost to a word length mismatch or test structures.

16. The computer program product of claim 11 in which the act of determining whether the second memory type or uncommitted logic gates are needed to form the sufficient quantity of the first memory type is performed by identifying logic gates that are not needed to implement the electronic design.

17. The computer program product of claim 16 in which a technology specification provided by a manufacturer of the electronic product is checked to determine how many of the logic gates are needed implement a quantity of the first memory type.

18. The computer program product of claim 11 in which the act of determining whether the second memory type or uncommitted logic gates are needed to form the sufficient quantity of the first memory type is performed by identifying a quantity of the second memory type that is not needed to satisfy specified requirements for the second memory type.

19. The computer program product of claim 11 in which a user interface is used to display the results, wherein the user interface comprises a bar chart having a separate bar for each electronic product being analyzed, wherein the bar chart provides a visual indicator of whether the electronic product having the array of uncommitted logic is capable of supporting the memory requirements for the electronic design.

20. The computer program product of claim 19 in which bars in the bar chart comprise different sections to represent different memory components, where a first section represents the first memory type, a second section represents the second memory type, and third section represents logic gates.

21. A system for mapping memory requirements for an electronic design to an electronic product having an array of uncommitted logic, comprising:
   a computer processor to execute a set of program code instructions;
   a memory to hold the program code instructions, in which the program code instructions comprises program code which, when executed by the computer processor, causes the computer processor to:
      identify memory requirements for an electronic design, wherein the memory requirements comprises a requirement for an amount of memory of a first memory type,
      determine whether the electronic product has a sufficient quantity of the first memory type that is embedded in the electronic product,
      determine whether the electronic product has a second memory type or uncommitted logic gates, which are embedded in the electronic product and are needed to meet the memory requirements, and
      identify or determine whether the electronic product having the embedded memory supports the memory requirements for the electronic design, wherein a design of the electronic product is not included in the electronic design when the electronic product is determined not to support the memory requirements, and
      display results of identifying whether the electronic product supports the memory requirements for the electronic design or storing the results in another non-transitory compute readable storage medium.

22. The system of claim 21 in which the first and second memory types comprise dual-port memory and single port memory.

23. The system of claim 21 in which the electronic product having the array of uncommitted logic comprises a FPGA or GA.

24. The system of claim 21 in which determining if the embedded memory on the electronic product contains the sufficient quantity of the first memory type takes into account memory overhead.

25. The system of claim 24 in which the memory overhead comprises memory lost to a word length mismatch or test structures.

26. The system of claim 21 in which determining whether the second memory type or uncommitted logic gates are needed to form the sufficient quantity of the first memory type is performed by identifying logic gates that are not needed to implement the electronic design.

27. The system of claim 26 in which a technology specification provided by a manufacturer of the electronic product is checked to determine how many of the logic gates are needed implement a quantity of the first memory type.

28. The system of claim 21 in which determining whether the second memory type or uncommitted logic gates are needed to form the sufficient quantity of the first memory type is performed by identifying a quantity of the second memory type that is not needed to satisfy specified requirements for the second memory type.

29. The system of claim 21 in which a user interface is used to display the results, wherein the user interface comprises a bar chart having a separate bar for each electronic product being analyzed, wherein the bar chart provides a visual indicator of whether the electronic product having the array of uncommitted logic is capable of supporting the memory requirements for the electronic design.

30. The system of claim 29 in which bars in the bar chart comprise different sections to represent different memory components, where a first section represents the first memory type, a second section represents the second memory type, and third section represents logic gates.

* * * * *